(12) United States Patent
Patten

(10) Patent No.: US 10,872,881 B2
(45) Date of Patent: Dec. 22, 2020

(54) MICROELECTRONIC PACKAGES WITH HIGH INTEGRATION MICROELECTRONIC DICE STACK

(71) Applicant: Intel IP Corporation, Santa Clara, CA (US)

(72) Inventor: Richard Patten, Langquaid (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/818,961

(22) Filed: Mar. 13, 2020

(65) Prior Publication Data

US 2020/0219844 A1 Jul. 9, 2020

Related U.S. Application Data

(63) Continuation of application No. 15/743,142, filed as application No. PCT/US2015/047420 on Aug. 28, 2015, now Pat. No. 10,622,333.

(51) Int. Cl.
*H01L 25/065* (2006.01)
*H01L 21/56* (2006.01)
(Continued)

(52) U.S. Cl.
CPC ........ *H01L 25/0652* (2013.01); *H01L 21/565* (2013.01); *H01L 23/3128* (2013.01); *H01L 23/49811* (2013.01); *H01L 23/5226* (2013.01); *H01L 24/09* (2013.01); *H01L 24/17* (2013.01); *H01L 24/24* (2013.01); *H01L 24/33* (2013.01); *H01L 24/73* (2013.01); *H01L 24/81* (2013.01);
(Continued)

(58) Field of Classification Search
CPC .......... H01L 24/00–98; H01L 25/0652; H01L 25/0657; H01L 2224/24226
See application file for complete search history.

(56) References Cited

U.S. PATENT DOCUMENTS 7,569,935 B1 * 8/2009 Fan ...................... H05K 3/3436
257/737
2008/0164605 A1 * 7/2008 Wu ..................... H01L 25/0657
257/723

(Continued)

OTHER PUBLICATIONS

International Search Report and Written Opinion for International Patent Application No. PCT/US2015/047420 dated May 25, 2016, 12 pgs.

(Continued)

*Primary Examiner* — Daniel P Shook
(74) *Attorney, Agent, or Firm* — Schwabe, Williamson & Wyatt, P.C.

(57) ABSTRACT

A microelectronic package may include stacked microelectronic dice, wherein a first microelectronic die is attached to a microelectronic substrate, and a second microelectronic die is stacked over at least a portion of the first microelectronic die, wherein the microelectronic substrate includes a plurality of pillars extending therefrom, wherein the second microelectronic die includes a plurality of pillars extending therefrom in a mirror-image configuration to the plurality of microelectronic substrate pillars, and wherein the second microelectronic die pillars are attached to microelectronic substrate pillars with an attachment material.

20 Claims, 7 Drawing Sheets

(51) Int. Cl.
- *H01L 25/00* (2006.01)
- *H01L 23/498* (2006.01)
- *H01L 23/31* (2006.01)
- *H01L 23/522* (2006.01)
- *H01L 23/00* (2006.01)

(52) U.S. Cl.
CPC .......... *H01L 25/0657* (2013.01); *H01L 25/50* (2013.01); *H01L 23/49822* (2013.01); *H01L 24/13* (2013.01); *H01L 24/16* (2013.01); *H01L 24/29* (2013.01); *H01L 24/32* (2013.01); *H01L 24/83* (2013.01); *H01L 2224/131* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/16227* (2013.01); *H01L 2224/24226* (2013.01); *H01L 2224/2919* (2013.01); *H01L 2224/32145* (2013.01); *H01L 2224/73203* (2013.01); *H01L 2224/73204* (2013.01); *H01L 2224/73253* (2013.01); *H01L 2224/81193* (2013.01); *H01L 2224/81203* (2013.01); *H01L 2224/81205* (2013.01); *H01L 2224/81207* (2013.01); *H01L 2224/81815* (2013.01); *H01L 2224/8385* (2013.01); *H01L 2225/06517* (2013.01); *H01L 2225/06562* (2013.01); *H01L 2225/06568* (2013.01); *H01L 2924/15311* (2013.01); *H01L 2924/181* (2013.01)

(56) References Cited

U.S. PATENT DOCUMENTS

| | | |
|---|---|---|
| 2009/0200651 A1 | 8/2009 | Kung et al. |
| 2009/0200652 A1 | 8/2009 | Oh et al. |
| 2012/0018877 A1 | 1/2012 | Yang et al. |
| 2013/0277801 A1 | 10/2013 | Chen et al. |

OTHER PUBLICATIONS

International Preliminary Report on Patentability for International Patent Application No. PCT/US2015/047420 dated Mar. 15, 2018, 9 pgs.

Office Action from Taiwan Patent Application No. 105121579, dated Nov. 18, 2019, 11 pages.

Notice of Allowance from Taiwan Patent Application No. 105121579, dated Feb. 27, 2020, 3 pages, with English translation.

* cited by examiner

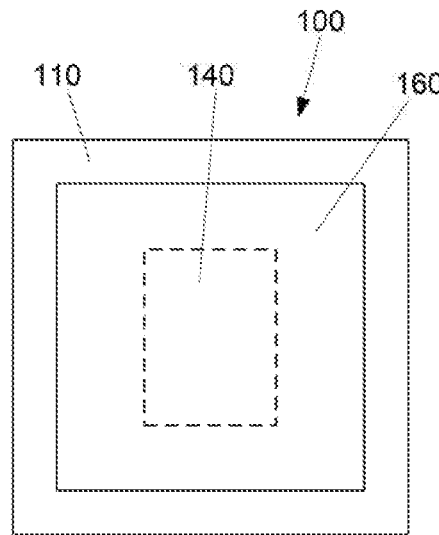
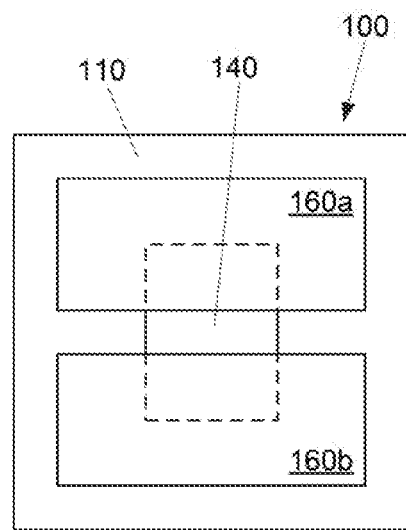
FIG. 10         FIG. 11
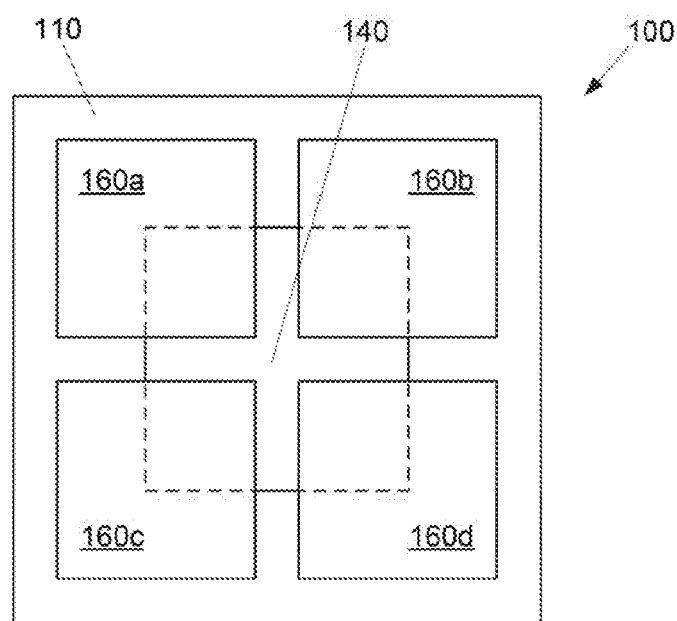
FIG. 12

MICROELECTRONIC PACKAGES WITH HIGH INTEGRATION MICROELECTRONIC DICE STACK

CROSS-REFERENCE TO RELATED APPLICATION

This patent application is a continuation of U.S. patent application Ser. No. 15/743,142, filed Jan. 9, 2018, which is a U.S. National Phase Application under 35 U.S.C. § 371 of International Application No. PCT/US2015/047420, filed Aug. 28, 2015, entitled "MICROELECTRONIC PACKAGES WITH HIGH INTEGRATION MICROELECTRONIC DICE STACK," which designates the United States of America, the entire disclosures of which are hereby incorporated by reference in their entirety and for all purposes.

TECHNICAL FIELD

Embodiments of the present description generally relate to the field of microelectronic package fabrication, and, more particularly, to a microelectronic dice stack configuration that reduces the size and height of the microelectronic package.

BACKGROUND

The microelectronic industry is continually striving to produce ever faster and smaller microelectronic packages for use in various electronic products, including, but not limited to, computer server products and portable products, such as portable computers, electronic tablets, cellular phones, digital cameras, and the like. One route to achieve these goals is the fabrication of microelectronic packages having stacked microelectronic dice therein resulting in relatively small lateral dimensions, low package heights, and high bandwidth between the microelectronic devices, which are important considerations for mobile and wireless applications. Numerous microelectronic dice stacking configures are known, including wirebond-wirebond (WBWB) stacking, flip-chip/wirebond (FCWB) stacking, thru-silicon-via (TSV) stacking, as well as package-on-package (POP) configurations. However, these stacking configurations may have significant disadvantages, as will be known to those skilled in the art. Therefore, there is an ongoing effort to improve the microelectronic dice stacking for microelectronic packages.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

FIGS. 10-12 are top views of microelectronic packages prior to encapsulation, according to various embodiments of the present description.

DESCRIPTION OF EMBODIMENTS

Figure 1:
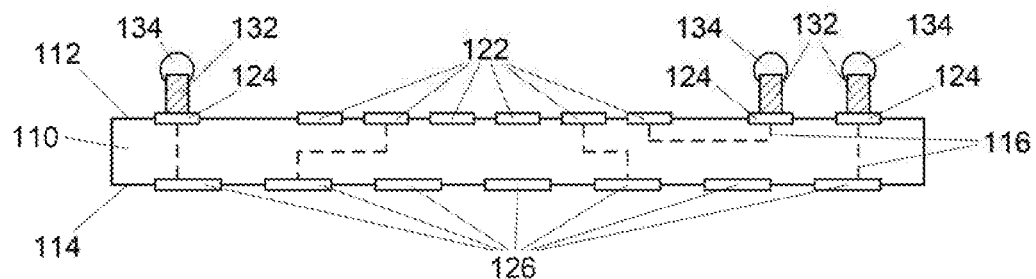
FIGS. 1-6 are side cross sectional views of processes for fabricating a microelectronic package of FIG. 1, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description include a microelectronic package having stacked microelectronic dice, wherein a first microelectronic die is attached to a microelectronic substrate, and a second microelectronic die is stacked over at least a portion of the first microelectronic die, wherein the microelectronic substrate includes a plurality of pillars extending therefrom, wherein the second microelectronic die includes a plurality of pillars extending therefrom in a mirror-image configuration to the plurality of microelectronic substrate pillars, and wherein the second microelectronic die pillars are attached to microelectronic substrate pillars with an attachment material.

FIGS. 1-5 illustrate an embodiment of fabricating a microelectronic package. As shown in FIG. 1, a microelectronic substrate 110 may be formed. The microelectronic substrate 110 may be any appropriate substrate, such as an interposer or the like, having a die attachment surface 112 and an opposing external connection surface 114. The microelectronic substrate 110 may have a plurality of bond pads, comprising at least one first microelectronic die attachment bond pad 122 and at least one second microelectronic die attachment bond pad 124, formed in or on the microelectronic substrate die attachment surface 112. The microelectronic substrate 110 may also have a plurality of external connection bond pads 126 formed on or in the microelectronic substrate external connection surface 114. The microelectronic substrate 110 may comprise a plurality of dielectric layers (not illustrated) having a plurality of conductive routes 116 formed therethrough, wherein the conductive routes 116 may form connections between appropriate bond pads, such as the first microelectronic die attachment bond pads 122, the second microelectronic die attachment bond pads 124, and/or the external connection bond pads 126.

The microelectronic substrate 110 may comprise any appropriate dielectric material, including, by not limited to, liquid crystal polymer, epoxy resin, bismaleimide triazine resin, FR4, polyimide materials, and the like. The conductive routes 116 may be formed of any appropriate conductive material, including, but not limited to, copper, silver, gold, nickel, and alloys thereof. It is understood that the microelectronic substrate 110 may be formed from any number of dielectric layers, may contain a rigid core (not shown), and may contain active and/or passive microelectronic devices (not shown) formed therein. It is further understood that the conductive routes 116 could form any desired electrical route within the microelectronic substrate 110 and/or with additional external components (not shown). It is also understood that solder resist layers (not shown) could be utilized on the microelectronic substrate die attachment surface 112 and/or the microelectronic substrate external connection surface 114, as will be understood to those skilled in the art. The processes used for forming the microelectronic substrate 110 are well known to those skilled in the art, and for the sake of brevity and conciseness will not be described or illustrated herein.

As further shown in FIG. 1, a microelectronic substrate pillar 132 may be attached to each of the second microelectronic die attachment bond pads 124, wherein the microelectronic substrate pillar 132 extends above the microelectronic substrate die attachment surface 112. The microelectronic substrate pillars 132 may be made of any appropriate conductive material, including, but not limited to, copper, silver, gold, nickel, and alloys thereof. A pillar-to-pillar attachment material 134 may be deposited on each microelectronic substrate pillar 132. In one embodiment, the pillar-to-pillar attachment material 134 may be deposited proximate an end of the microelectronic substrate pillar 132 that is substantially opposite its respective second microelectronic die attachment bond pad 124. The pillar-to-pillar attachment material 134 may be any appropriate material, including, but not limited to, solders such as lead/tin alloys (e.g. 63% tin/37% lead solder) or lead-free solders, such a pure tin or high tin content alloys (e.g. 90% or more tin), such as tin/bismuth, eutectic tin/silver, ternary tin/silver/copper, eutectic tin/copper, and similar alloys.

Figure 2:
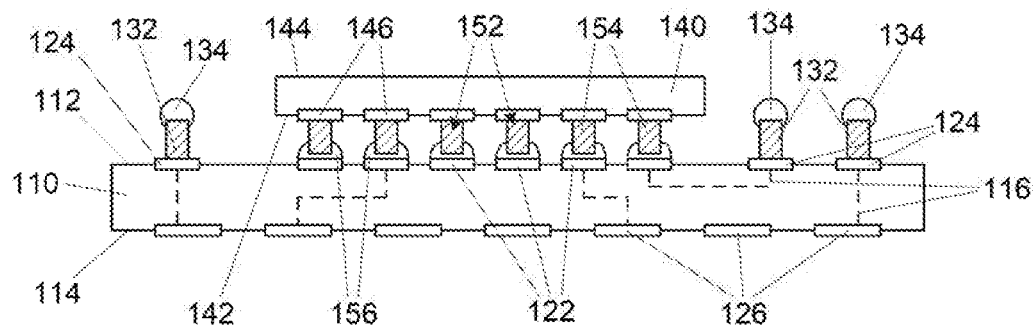

As shown in FIG. 2, a first microelectronic die 140 having an active surface 142 and an opposing back surface 144 may be attached to corresponding first microelectronic die attachment bond pads 122 with a plurality of die-to-substrate interconnects 152, in a configuration generally known as a flip-chip or controlled collapse chip connection ("C4") configuration. The die-to-substrate interconnects 152 may extend between the first microelectronic die attachment bond pads 122 of the microelectronic substrate 110 and mirror-image bond pads 146 on the first microelectronic die active surface 142 to form an electrical connection therebetween. The die-to-substrate interconnects 152 may comprise a first microelectronic die pillar 154 attached to the first microelectronic die bond pads 146 and a solder bump 156 attaching the first microelectronic die pillar 154 to its respective first microelectronic die attachment bond pad 122 of the microelectronic substrate 110. As will be understood to those skilled in the art, the plurality of die-to-substrate interconnects 152 may simply be the solder bumps 156 extending between the first microelectronic die attachment bond pads 122 of the microelectronic substrate 110 and the first microelectronic die bond pads 146 without the first microelectronic die pillars 154. It is understood that the first microelectronic die bond pads 146 may be in electrical communication with integrated circuitry (not shown) within the first microelectronic die 140. The first microelectronic die 140 may be any appropriate microelectronic device, including, but not limited to a microprocessor, a chipset, a graphics device, a wireless device, a memory device, an application specific integrated circuit device, and the like.

The first microelectronic die pillar 154 may be formed of any appropriate conductive material, including, but not limited to, copper, silver, gold, nickel, and alloys thereof. The solder bumps 156 can be made any appropriate material, including, but not limited to, solders such as lead/tin alloys (e.g. 63% tin/37% lead solder) or lead-free solders, such a pure tin or high tin content alloys (e.g. 90% or more tin), such as tin/bismuth, eutectic tin/silver, ternary tin/silver/copper, eutectic tin/copper, and similar alloys. When the first microelectronic die 140 is attached to the microelectronic substrate 110, the solder bump 156 is reflowed, either by heat, pressure, and/or sonic energy to secure the solder between the first microelectronic die pillars 154 and the first microelectronic die attachment bond pads 122. It is further understood that, an electrically-insulating flowable material, such as an underfill material (not shown), may be disposed between the first microelectronic die 140 and the microelectronic substrate 110, which substantially encapsulates the die-to-substrate interconnects 152.

Figure 3:
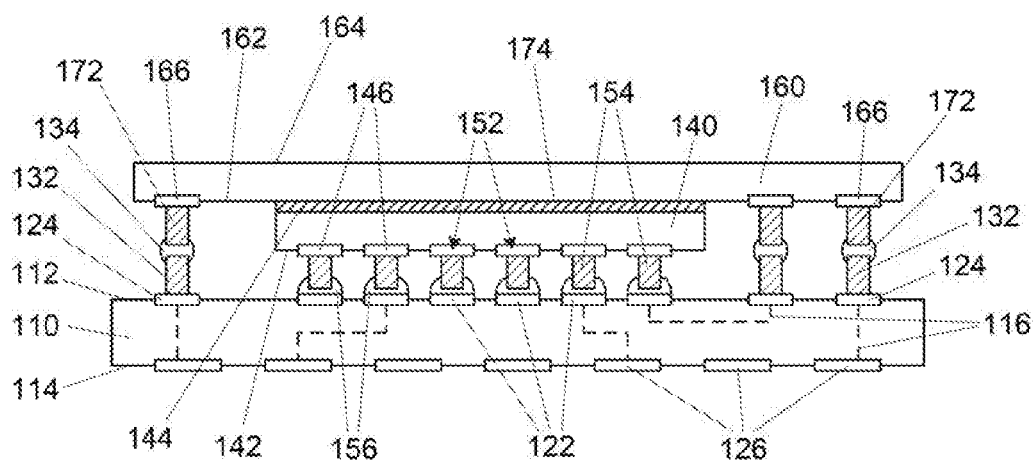

As shown in FIG. 3, a second microelectronic die 160 having an active surface 162 and an opposing back surface 164 may be attached to the microelectronic substrate 110, such that a portion of the second microelectronic die 160 extends over a portion of the first microelectronic die 140. The second microelectronic die 160 may have at least one bond pad 166 formed in or on the second microelectronic die active surface 162, where the second microelectronic die bond pads 166 may be in a mirror-image configuration to the second microelectronic die attachment bond pads 124 of the microelectronic substrate 110. A second microelectronic die pillar 172 may be attached to each of the second microelectronic die bond pads 166, wherein the second microelectronic die pillar 172 extends from the second microelectronic die active surface 162, which results in the wherein the second microelectronic die pillars 172 being in a mirror-image configuration to the microelectronic substrate pillars 132. The second microelectronic die pillars 172 may be made of any appropriate conductive material, including, but not limited to, copper, silver, gold, nickel, and alloys thereof. The second microelectronic die 160 may be attached to the microelectronic substrate 110 with the pillar-to-pillar attachment material 134. In one embodiment, where the pillar-to-pillar attachment material 134 is a solder material, the pillar-to-pillar attachment material 134 is reflowed, either by heat, pressure, and/or sonic energy to secure the solder between the microelectronic substrate pillars 132 and the second microelectronic die pillars 172. In one embodiment, a portion of the pillar-to-pillar attachment material 134 may be disposed between the microelectronic substrate pillar 132 and the second microelectronic die pillar 172.

As further shown in FIG. 3, at least a portion of the second microelectronic die active surface 162 may be optionally secured to the first microelectronic die back surface 144 with an adhesive material 174.

Figure 4:
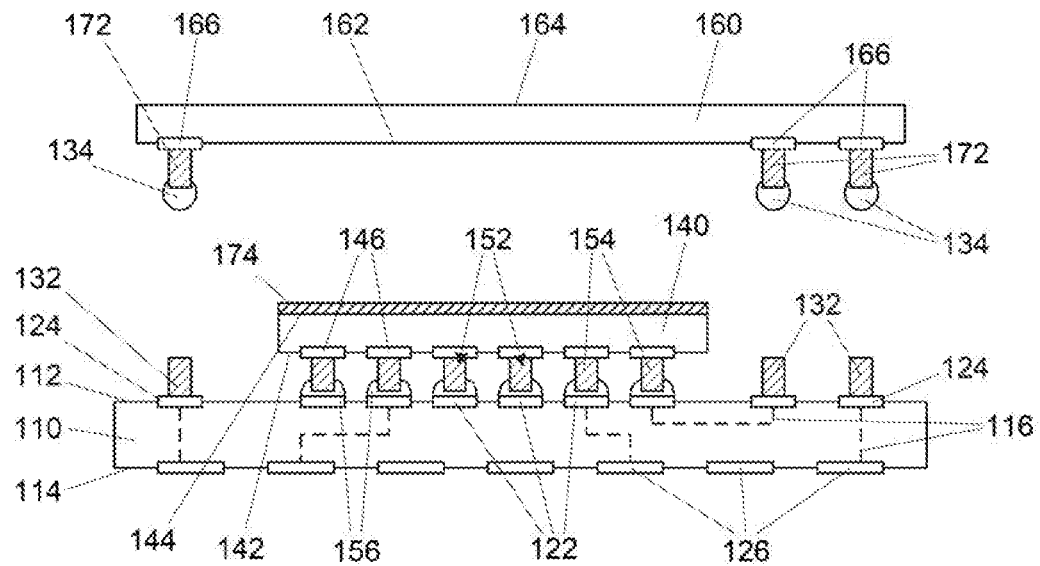

It is understood that the pillar-to-pillar attachment material 134 may be deposited on the second microelectronic die pillars 172, as shown in FIG. 4, prior to attaching second microelectronic die 160 to form the structure of FIG. 3, rather than depositing the pillar-to-pillar attachment material 134 on the substrate pillars 132, as shown in FIG. 1.

It is understood that the second microelectronic die bond pads 166 may be in electrical communication with integrated circuitry (not shown) within the second microelectronic die 160. The second microelectronic die 160 may be any appropriate microelectronic die, including, but not limited to a microprocessor, a chipset, a graphics device, a wireless device, a memory device, an application specific integrated circuit device, and the like.

Figure 5:
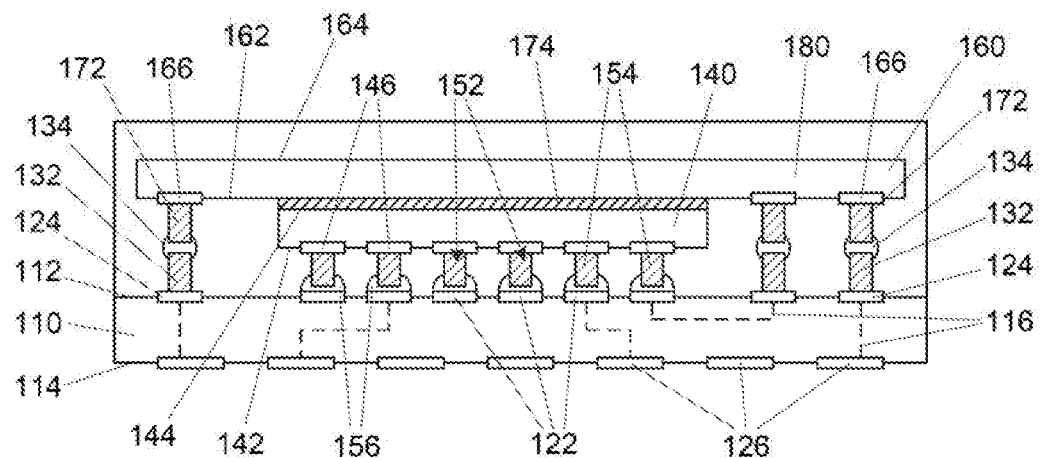

As shown in FIG. 5, after the attachment of the second microelectronic die 160, a mold material 180 may be disposed over the first microelectronic die 140 and the second microelectronic die 160 to form a microelectronic package 100. In one embodiment, the mold material 180 may substantially encapsulate both the first microelectronic die 140 and the second microelectronic die 160, as well as the microelectronic substrate pillars 132, the second microelectronic die pillars 172, and the pillar-to-pillar attachment material 134. The mold material 180 may be any appropriate encapsulation material, such as an epoxy resins and filled epoxy resins. The mold material 180 may be formed by an known method, including but not limited, a mold underfilling process or a chip underfilling process followed by a known molding process, such mold material injection into a mold chase, as will be understood to those skilled in the art.

Figure 6:
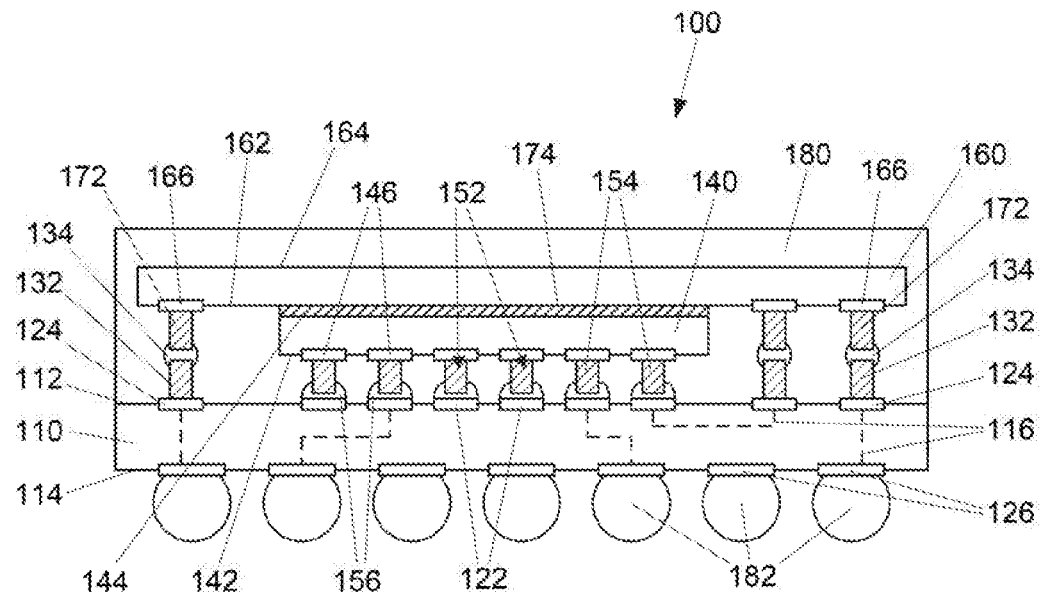

As shown in FIG. 6, external attachment interconnects 182 may be formed on the external connection bond pads 126 of the microelectronic substrate 110 for the attachment of the microelectronic package 100 to any external component (not shown), such as a motherboard. In one embodiment, the external attachment interconnects 182 may comprise solder balls.

Figure 7:
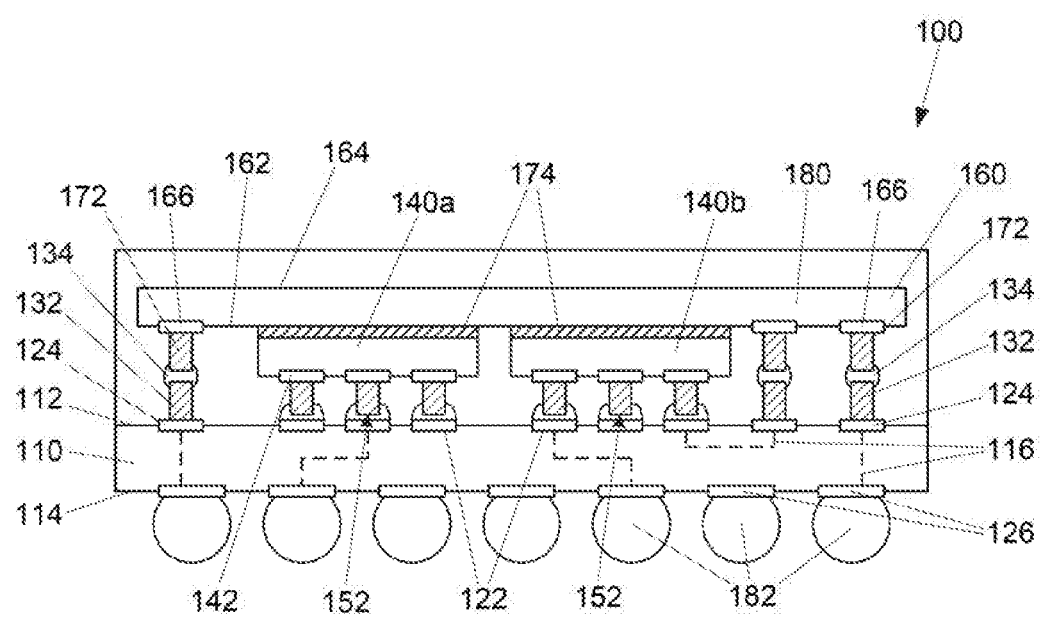
FIGS. 7-9 are side cross sectional views of microelectronic packages, according to various embodiments of the present description.
Figure 8:
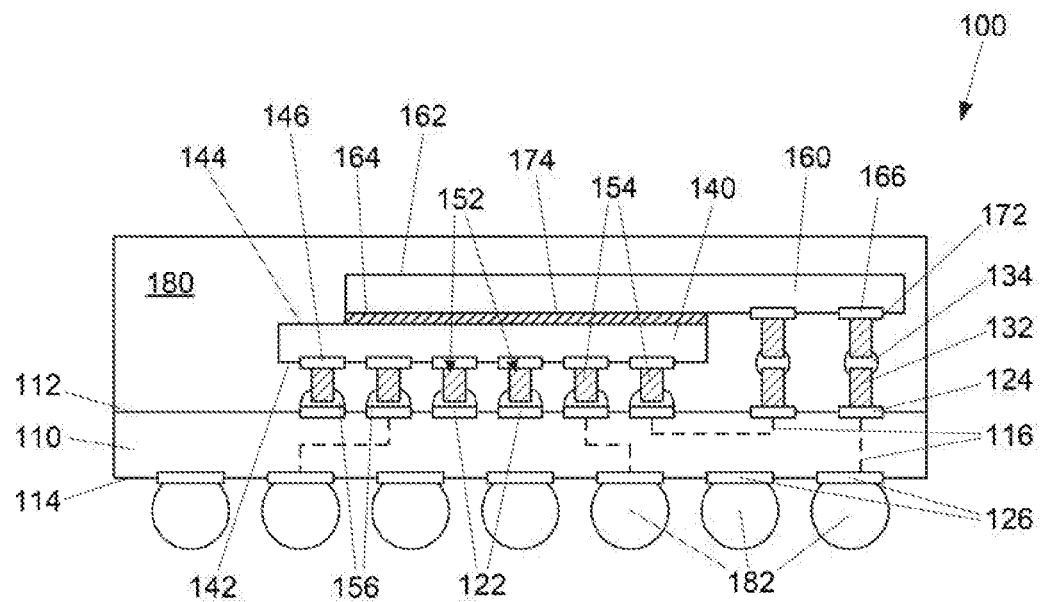
Figure 9:
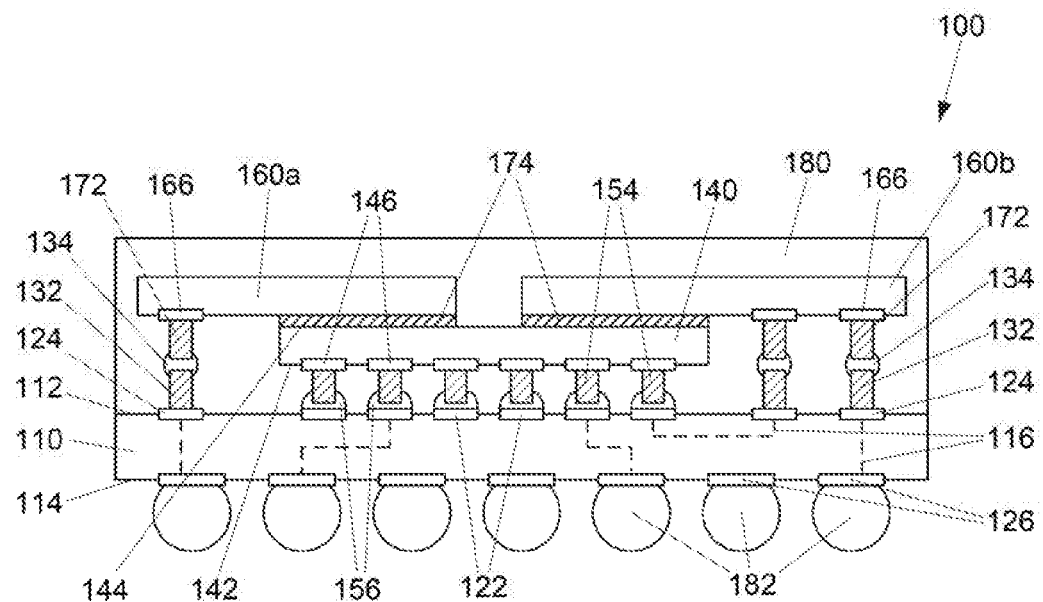

It understood that the microelectronic package 100 may have a variety of component configurations. In an embodiment shown in FIG. 7, the microelectronic package 100 may include a plurality of first microelectronic dice (labeled as elements 140a and 140b). In another embodiment shown in FIG. 8, the microelectronic package 100 have a second microelectronic die 160 that does not entirely extend over the first microelectronic die 140. In a further embodiment shown in FIG. 9, the microelectronic package 100 may include a plurality of second microelectronic dice (labeled as elements 160a and 160b).

It understood that the microelectronic package 100 may have a variety of placement configurations, wherein FIGS. 10-12 illustrate top plane views of the microelectronic package 100 without the mold material 180 shown. As shown in FIG. 10, the microelectronic package 100 may comprise the first microelectronic die 140 is completely disposed between the microelectronic substrate 110 and the second microelectronic die 160, which may correspond to FIG. 5. As shown in FIG. 11, the microelectronic package 100 may comprises a pair of second microelectronic dice (labeled as elements 160a and 160b) which both straddle a portion the first microelectronic die 140. As shown in FIG. 12, the microelectronic package 100 may comprise several of second microelectronic dice (labeled as elements 160a, 160b, 160c, and 160d) which each straddle a portion the first microelectronic die 140.

Figure 13:
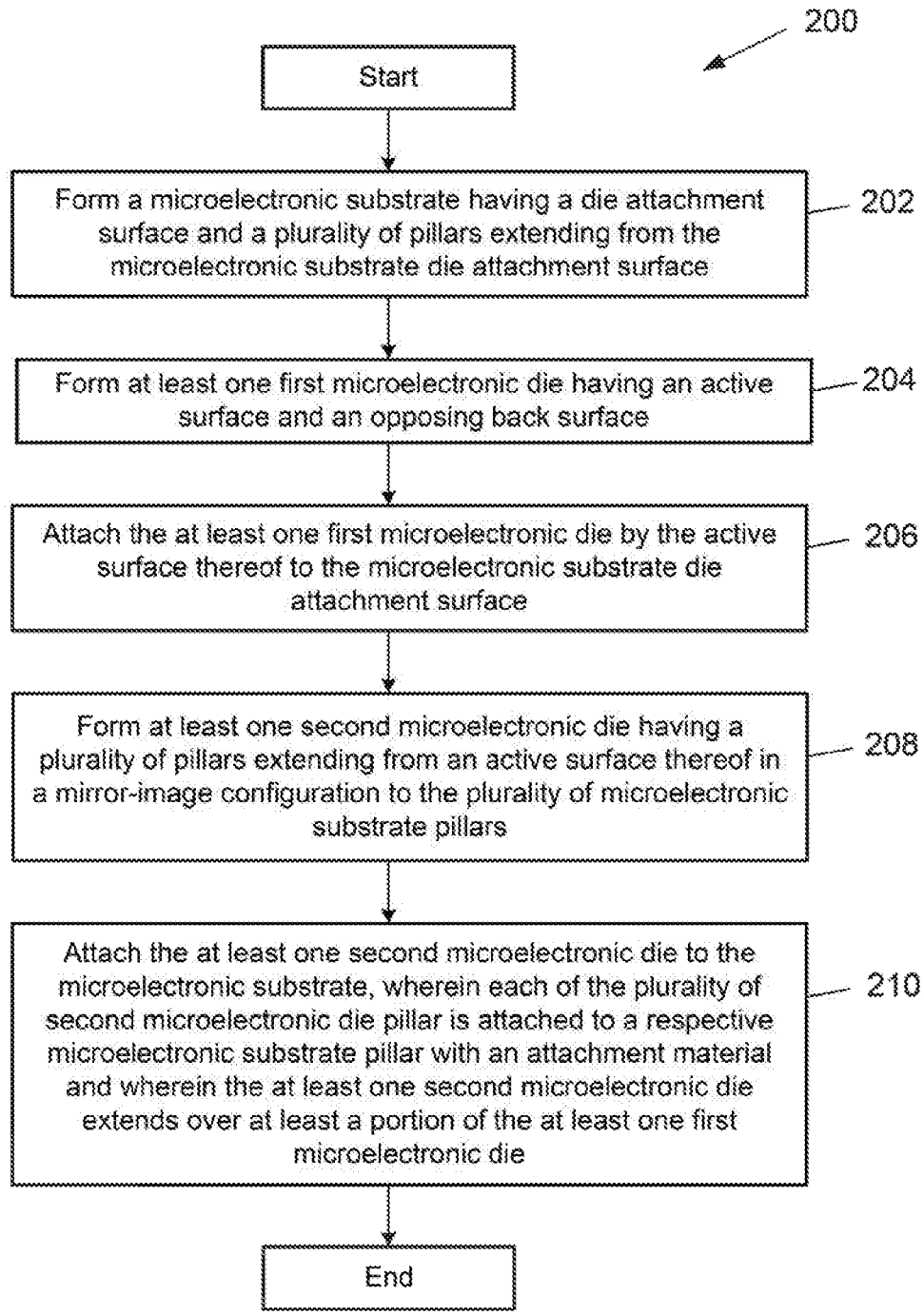
FIG. 13 is a flow diagram of a process of fabricating a microelectronic package, according to an embodiment of the present description.

FIG. 13 is a flow chart of a process 200 of fabricating a microelectronic package according to an embodiment of the present description. As set forth in block 202, a microelectronic substrate having a die attachment surface and a plurality of pillars extending from the microelectronic substrate die attachment surface may be formed. At least one first microelectronic die having an active surface and an opposing back surface may be formed, as set forth in block 204. As set forth in block 206, the at least one first microelectronic die may be attached by the active surface thereof to the microelectronic substrate die attachment surface. At least one second microelectronic die having a plurality of pillars extending from an active surface thereof in a mirror-image configuration to the plurality of microelectronic substrate pillars, as set forth in block 208. As set forth in block 210, the at least one second microelectronic die is attached to the microelectronic substrate, wherein each of the plurality of second microelectronic die pillar is attached to a respective microelectronic substrate pillar with an attachment material and wherein the at least one second microelectronic die extends over at least a portion of the at least one first microelectronic die.

Figure 14:
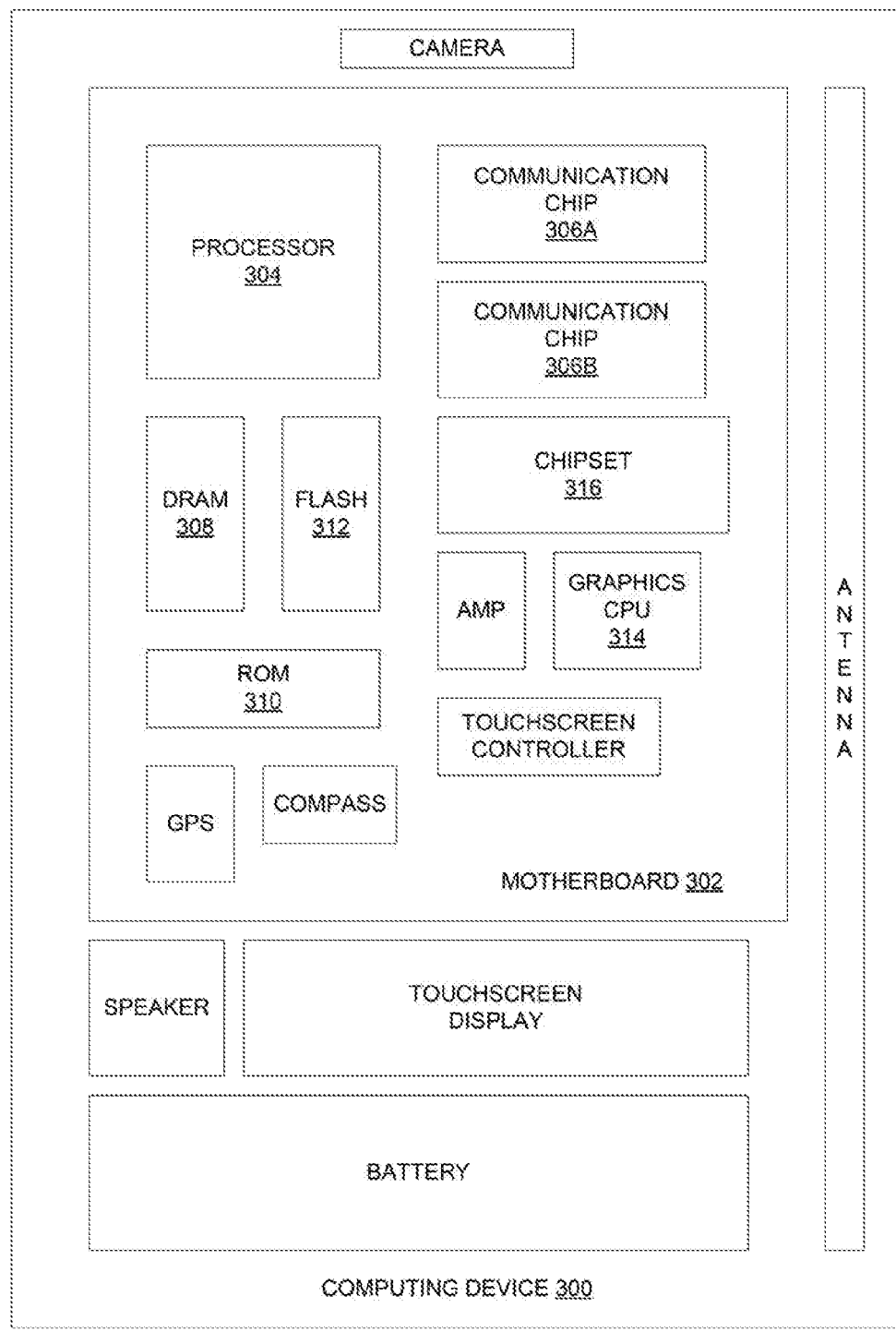
FIG. 14 illustrates a computing device in accordance with one implementation of the present description.

FIG. 14 illustrates a computing device 300 in accordance with one implementation of the present description. The computing device 300 houses a board 302. The board may include a number of microelectronic components, including but not limited to a processor 304, at least one communication chip 306A, 306B, volatile memory 308, (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 302. In some implementations, at least one of the microelectronic components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 300 may include a microelectronic package having a microelectronic dice stack, as described herein.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-14. The subject matter may be applied to other microelectronic device and assembly applications, as will be understood to those skilled in the art.

The following examples pertain to further embodiments, wherein Example 1 is a microelectronic package, comprising a microelectronic substrate having a die attachment surface and a plurality of pillars extending from the microelectronic substrate die attachment surface; at least one first microelectronic die having an active surface and an opposing back surface attached by its active surface to the microelectronic substrate die attachment surface; and at least one second microelectronic die extending over at least a portion of the at least one first microelectronic die and having a plurality of pillars extending from an active surface thereof in a mirror-image configuration to the plurality of microelectronic substrate pillars, wherein each of the plurality of second microelectronic die pillars is attached to a respective microelectronic substrate pillar with an attachment material.

In Example 2, the subject matter of Example 1 can optionally include the attachment material comprising a solder material.

In Example 3, the subject matter of Example 1 can optionally include a mold material disposed over the first microelectronic die and the second microelectronic die.

In Example 4, the subject matter of Example 2 can optionally include the mold material encapsulates the first microelectronic die, the second microelectronic die, the plurality of microelectronic substrate pillars, the plurality of second microelectronic die pillars, and the attachment material.

In Example 5, the subject matter of Example 1 can optionally include an adhesive material disposed between the first microelectronic die back surface and the second microelectronic die active surface.

In Example 6, the subject matter of any of Examples 1 to 5 can optionally include the microelectronic substrate further including an external connection surface opposing the microelectronic substrate die attachment surface and further including at least one external attachment interconnect attached to the microelectronic substrate external connection surface.

In Example 7, the subject matter of any one of Examples 1 to 5 can optionally include the at least one first microelectronic die attached by its active surface to the microelectronic substrate die attachment surface with at least one interconnect.

In Example 8, the subject matter of Example 1 can optionally include the microelectronic substrate including a plurality of second microelectronic die attachment bond pads and wherein the plurality of microelectronic substrate pillars are attached to the plurality of second microelectronic die attachment bond pads.

In Example 9, the subject matter of Example 1 can optionally include the second microelectronic die includes a plurality of bond pads and wherein the plurality of second microelectronic die pillars are attached to the plurality of second microelectronic die bond pads.

The following examples pertain to further embodiments, wherein Example 10 is a method of fabricating a microelectronic package comprising forming a microelectronic substrate having a die attachment surface and a plurality of pillars extending from the microelectronic substrate die attachment surface; forming at least one first microelectronic die having an active surface and an opposing back surface; attaching the at least one first microelectronic die by the active surface thereof to the microelectronic substrate die attachment surface; forming at least one second microelectronic die having a plurality of pillars extending from an active surface thereof in a mirror-image configuration to the plurality of microelectronic substrate pillars; and attaching the at least one second microelectronic die to the microelectronic substrate, wherein each of the plurality of second microelectronic die pillars is attached to a respective microelectronic substrate pillar with an attachment material and wherein the at least one second microelectronic die extends over at least a portion of the at least one first microelectronic die.

In Example 11, the subject matter of Example 10 can optionally include attaching each of the plurality of second microelectronic die pillars to a respective microelectronic substrate pillar with an attachment material comprising a solder material.

In Example 12, the subject matter of Example 10 can optionally include disposing a mold material over the first microelectronic die and the second microelectronic die.

In Example 13, the subject matter of Example 12 can optionally include disposing the mold material to encapsulate the first microelectronic die, the second microelectronic die, the plurality of microelectronic substrate pillars, the plurality of second microelectronic die pillars, and the attachment material.

In Example 14, the subject matter of Example 10 can optionally include disposing an adhesive material between the first microelectronic die back surface and the second microelectronic die active surface.

In Example 15, the subject matter of any of Examples 10 to 14 can optionally include the microelectronic substrate further including an external connection surface opposing the microelectronic substrate die attachment surface and further including forming at least one external attachment interconnect on the microelectronic substrate external connection surface.

In Example 16, the subject matter of any of Examples 10 to 14 can optionally include attaching the at least one first microelectronic die by its active surface to the microelectronic substrate die attachment surface with at least one interconnect.

In Example 17, the subject matter of Example 10 can optionally include forming a plurality of second microelectronic die attachment bond pads in or on the microelectronic substrate die attachment surface and wherein the plurality of microelectronic substrate pillars are attached to the plurality of second microelectronic die attachment bond pads.

In Example 18, the subject matter of Example 10 can optionally include forming the second microelectronic die further comprises forming a plurality of bond pads in or on the second microelectronic die active surface and wherein the plurality of second microelectronic die pillars are attached to the plurality of second microelectronic die bond pads.

The following examples pertain to further embodiments, wherein Example 19 is a method of fabricating an electronic system, comprising a board; and a microelectronic package on the board, wherein the microelectronic package comprises a microelectronic substrate having a die attachment surface and a plurality of pillars extending from the microelectronic substrate die attachment surface; at least one first microelectronic die having an active surface and an opposing back surface attached by its active surface to the microelectronic substrate die attachment surface; and at least one second microelectronic die extending over at least a portion of the at least one first microelectronic die and having a plurality of pillars extending from an active surface thereof in a mirror-image configuration to the plurality of microelectronic substrate pillars, wherein each of the plurality of second microelectronic die pillars is attached to a respective microelectronic substrate pillar with an attachment material.

In Example 20, the subject matter of Example 19 can optionally include the attachment material comprising a solder material.

In Example 21, the subject matter of Example 19 can optionally include a mold material disposed over the first microelectronic die and the second microelectronic die.

In Example 22, the subject matter of Example 20 can optionally include the mold material encapsulates the first microelectronic die, the second microelectronic die, the plurality of microelectronic substrate pillars, the plurality of second microelectronic die pillars, and the attachment material.

In Example 23, the subject matter of Example 19 can optionally include an adhesive material disposed between the first microelectronic die back surface and the second microelectronic die active surface.

In Example 24, the subject matter of any of Examples 19 to 23 can optionally include the microelectronic substrate further including an external connection surface opposing the microelectronic substrate die attachment surface and further including at least one external attachment interconnect attached to the microelectronic substrate external connection surface.

In Example 25, the subject matter of any one of Examples 19 to 23 can optionally include the at least one first microelectronic die attached by its active surface to the microelectronic substrate die attachment surface with at least one interconnect.

In Example 26, the subject matter of Example 19 can optionally include the microelectronic substrate including a plurality of second microelectronic die attachment bond pads and wherein the plurality of microelectronic substrate pillars are attached to the plurality of second microelectronic die attachment bond pads.

In Example 27, the subject matter of Example 19 can optionally include the second microelectronic die includes a plurality of bond pads and wherein the plurality of second microelectronic die pillars are attached to the plurality of second microelectronic die bond pads.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic package, comprising:
a microelectronic substrate having a die attachment surface and a plurality of pillars extending from the microelectronic substrate die attachment surface;
at least one first microelectronic die having an active surface and an opposing back surface, the at least one first microelectronic die attached by its active surface to the microelectronic substrate die attachment surface by a plurality of pillars of the at least one first microelectronic die and corresponding solder bumps on die attachment bond pads of the microelectronic substrate;
at least one second microelectronic die extending over at least a portion of the at least one first microelectronic die and having a plurality of pillars extending from an active surface thereof, the active surface opposite a back surface, wherein each of the plurality of second microelectronic die pillars is attached to a respective microelectronic substrate pillar with an attachment material; and
a mold material on the back surface of the at least one second microelectronic die.

2. The microelectronic package of claim 1, wherein the attachment material comprises a solder material.

3. The microelectronic package of claim 1, wherein the mold material encapsulates the first microelectronic die, the second microelectronic die, the plurality of microelectronic substrate pillars, the plurality of second microelectronic die pillars, and the attachment material.

4. The microelectronic package of claim 1, further including an adhesive material disposed between the first microelectronic die back surface and the second microelectronic die active surface.

5. The microelectronic package of claim 1, wherein the microelectronic substrate further includes an external connection surface opposing the microelectronic substrate die attachment surface and further including at least one external attachment interconnect attached to the microelectronic substrate external connection surface.

6. The microelectronic package of claim 1, wherein the at least one first microelectronic die is attached by its active surface to the microelectronic substrate die attachment surface with at least one interconnect.

7. The microelectronic package of claim 1, wherein the microelectronic substrate includes a plurality of second microelectronic die attachment bond pads and wherein the plurality of microelectronic substrate pillars are attached to the plurality of second microelectronic die attachment bond pads.

8. The microelectronic package of claim 1, wherein the second microelectronic die includes a plurality of bond pads and wherein the plurality of second microelectronic die pillars are attached to the plurality of second microelectronic die bond pads.

9. A method of forming a microelectronic package, comprising:

forming a microelectronic substrate having a die attachment surface and a plurality of pillars extending from the microelectronic substrate die attachment surface, wherein the plurality of pillars has an attachment material thereon;

forming at least one first microelectronic die having an active surface and an opposing back surface;

attaching the at least one first microelectronic die by the active surface thereof to the microelectronic substrate die attachment surface by a plurality of pillars of the at least one first microelectronic die and corresponding solder bumps on die attachment bond pads of the microelectronic substrate;

forming at least one second microelectronic die having a plurality of pillars extending from an active surface thereof, the active surface opposite a back surface;

attaching the at least one second microelectronic die to the microelectronic substrate, wherein each of the plurality of second microelectronic die pillars is attached to a respective microelectronic substrate pillar with the attachment material and wherein the at least one second microelectronic die extends over at least a portion of the at least one first microelectronic die; and disposing a mold material on the back surface of the at least one second microelectronic die.

10. The method of claim 9, wherein attaching the at least one second microelectronic die to the microelectronic substrate comprises attaching each of the plurality of second microelectronic die pillars to a respective microelectronic substrate pillar with an attachment material comprising a solder material.

11. The method of claim 9, wherein disposing the mold material encapsulates the first microelectronic die, the second microelectronic die, the plurality of microelectronic substrate pillars, the plurality of second microelectronic die pillars, and the attachment material.

12. The method of claim 9, further comprising disposing an adhesive material between the first microelectronic die back surface and the second microelectronic die active surface.

13. The method of claim 9, wherein the microelectronic substrate further includes an external connection surface opposing the microelectronic substrate die attachment surface and further including forming at least one external attachment interconnect on the microelectronic substrate external connection surface.

14. The method of claim 9, wherein attaching the at least one first microelectronic die by its active surface to the microelectronic substrate die attachment surface comprises attaching the at least one first microelectronic die by its active surface to the microelectronic substrate die attachment surface with at least one interconnect.

15. The method of claim 9, wherein forming the microelectronic substrate further comprises forming a plurality of second microelectronic die attachment bond pads in or on the microelectronic substrate die attachment surface and wherein the plurality of microelectronic substrate pillars are attached to the plurality of second microelectronic die attachment bond pads.

16. The method of claim 9, wherein forming the second microelectronic die further comprises forming a plurality of bond pads in or on the second microelectronic die active surface and wherein the plurality of second microelectronic die pillars are attached to the plurality of second microelectronic die bond pads.

17. An electronic system, comprising:
a board; and
a microelectronic package on the board, wherein the microelectronic package comprises: a microelectronic substrate having a die attachment surface and a plurality of pillars extending from the microelectronic substrate die attachment surface;
at least one first microelectronic die having an active surface and an opposing back surface, the at least one first microelectronic die attached by its active surface to the microelectronic substrate die attachment surface by a plurality of pillars of the at least one first microelectronic die and corresponding solder bumps on die attachment bond pads of the microelectronic substrate;
at least one second microelectronic die extending over at least a portion of the at least one first microelectronic die and having a plurality of pillars extending from an active surface thereof, the active surface opposite a back surface, wherein each of the plurality of second microelectronic die pillars is attached to a respective microelectronic substrate pillar with an attachment material; and
a mold material on the back surface of the at least one second microelectronic die.

18. The electronic system of claim 17, wherein the attachment material comprises a solder material.

19. The electronic system of claim 17, wherein the mold material encapsulates the first microelectronic die, the second microelectronic die, the plurality of microelectronic substrate pillars, the plurality of second microelectronic die pillars, and the attachment material.

20. The electronic system of claim 17, further including an adhesive material disposed between the first microelectronic die back surface and the second microelectronic die active surface.

* * * * *